US008581187B2

(12) United States Patent
Kijima et al.

(10) Patent No.: US 8,581,187 B2
(45) Date of Patent: Nov. 12, 2013

(54) METHOD FOR MEASURING SAMPLE AND MEASUREMENT DEVICE

(75) Inventors: Mihoko Kijima, Tsukuba (JP); Shunsuke Koshihara, Hitachinaka (JP); Hitoshi Komuro, Hitachinaka (JP); Ryoichi Matsuoka, Yotsukaido (JP)

(73) Assignee: Hitachi High-Technologies Corporation, Tokyo (JP)

( * ) Notice: Subject to any disclaimer, the term of this patent is extended or adjusted under 35 U.S.C. 154(b) by 0 days.

(21) Appl. No.: 13/059,601

(22) PCT Filed: Sep. 16, 2009

(86) PCT No.: PCT/JP2009/004619
§ 371 (c)(1),
(2), (4) Date: Feb. 17, 2011

(87) PCT Pub. No.: WO2010/038368
PCT Pub. Date: Apr. 8, 2010

(65) Prior Publication Data
US 2011/0139982 A1     Jun. 16, 2011

(30) Foreign Application Priority Data
Sep. 30, 2008   (JP) ................................. 2008-252132

(51) Int. Cl.
*G01N 23/225* (2006.01)
(52) U.S. Cl.
USPC ......................................... 250/307; 250/310
(58) Field of Classification Search
USPC .................. 250/306, 307, 310, 492.22, 492.3
See application file for complete search history.

(56) References Cited

U.S. PATENT DOCUMENTS

| 7,652,271 | B2* | 1/2010 | Wake et al. ............... 250/492.22 |
| 7,923,703 | B2* | 4/2011 | Morokuma et al. .......... 250/307 |
| 2006/0262977 | A1* | 11/2006 | Mitsui ........................... 382/209 |
| 2007/0003878 | A1* | 1/2007 | Paxton et al. ................. 430/311 |
| 2007/0023653 | A1* | 2/2007 | Toyoda et al. ................. 250/310 |
| 2007/0221842 | A1* | 9/2007 | Morokuma et al. .......... 250/307 |
| 2008/0022240 | A1 | 1/2008 | Nojima |
| 2008/0121804 | A1* | 5/2008 | Nakasuji et al. .............. 250/310 |
| 2008/0138916 | A1* | 6/2008 | Mitsui ............................. 438/16 |
| 2009/0242760 | A1* | 10/2009 | Miyamoto et al. ........... 250/307 |
| 2010/0158389 | A1* | 6/2010 | Mitsui .......................... 382/199 |

FOREIGN PATENT DOCUMENTS

| JP | 2000-266706 A | 9/2000 |
| JP | 2007-248087 A | 9/2007 |
| JP | 2007-310085 A | 11/2007 |
| JP | 2008-118033 A | 5/2008 |

* cited by examiner

*Primary Examiner* — David A Vanore
*Assistant Examiner* — Wyatt Stoffa
(74) *Attorney, Agent, or Firm* — Miles & Stockbridge P.C.

(57) ABSTRACT

An amount of displacement and an overlapping area between first and second patterns formed through a double patterning lithography process can be determined. The first pattern is formed by a first exposure while the second pattern is formed by a later second exposure. A first image of the first pattern is formed prior to the formation of the second pattern. A second image of both patterns is formed after the formation of the second pattern. A two-step matching process between combined information and images of the first and second patterns is performed. The combined information includes information regarding the first pattern, as formed, combined with design information of the second pattern. Based on a moving amount of the design information of the second pattern, a displacement amount between the first and second patterns is determined.

13 Claims, 13 Drawing Sheets

600 : 1st Contour GDS
601 : 1st pattern
602 : 2nd Design GDS
603 : 2nd pattern
604 : GDS data
605 : Wafer pattern 701
703
702
704

| ID | obj | RC | X-dis | Y-dis | DO | AR | DD | PF | RDA |
|---|---|---|---|---|---|---|---|---|---|
| 5 | LE/LE | L/R | 10.6 | −7.8 | 109 | 0.95 | | | |
| 6 | LE/LE | L/R | 8.3 | 10.6 | 80 | 0.87 | | | |
| 7 | LE/LE | L/R | −6.2 | 9.77 | 62 | 1.03 | | | |
| 8 | LE/LE | T/B | 8.88 | 7.9 | 73 | 0.98 | | | |
| 9 | LC/LE | L/R | − | − | − | − | | | |
| 10 | LC/LE | T/B | 5.36 | 12.6 | 66 | 0.5 | | | |
| 11 | LE/LE | L/T | − | − | − | − | | | |
| 12 | LE/LC | R/B | − | − | − | − | | | |

METHOD FOR MEASURING SAMPLE AND MEASUREMENT DEVICE

TECHNICAL FIELD

The present invention relates to a method for measuring a semiconductor device and the like and more particularly, to a measurement method suitable for evaluating a pattern formed by a double patterning technique using a reduced projection type exposure apparatus and a device therefor.

BACKGROUND ART

A stepper (reduced projection exposure apparatus) representing one of semiconductor device manufacturing apparatuses is an apparatus in which a pattern formed through a photo-mask or reticle is projected reducibly on a semiconductor wafer coated with resist.

Nowadays, with a pattern formed with extremely minute features, a method for measuring or inspecting the formed pattern and evaluating the completeness thereof by using a scanning electron microscope or the like has been leading the semiconductor measurement and inspection. For example, Patent Literature 1 proposes a method for evaluating overlap of patterns stacked into multiple layers. The overlap between upper and lower layers is an important evaluation item for making a decision as to whether the connection between the upper and lower layers is set up properly.

CITATION LIST

Patent Literature

Patent Literature 1: JP-A-2007-248087

SUMMARY OF INVENTION

Technical Problem

Next generation devices employ patterns with feature size that are far smaller than a wavelength of a light source used for the stepper. Thus, modern lithographic systems rely on various super-resolution techniques.

It is expected that the development of novel techniques for next generation device manufacturing will continue in the future.

Of a variety of super-resolution techniques, the double patterning technique (double exposure technique) which can utilize the existing exposure apparatus or can permit further miniaturization even in a novel exposure apparatus expected to be introduced in future has been noticed as a near future lithography technique and at present, a method/parameter for process evaluation and process control in the double patterning technique has been studied.

In the double patterning representing a lithography method for performing exposure plural times by dividing or splitting design data of a single layer into divisions corresponding to two masks, the k1 value can be increased through the division of design, thereby lowering difficulties in lithography. In one example, a series of first patterning→working 1→second patterning→working 2 repeats itself to complete patterning of a single layer on a wafer.

The double patterning faces a serious problem of misalignment between the first patterning and the second patterning (referred to as overlap accuracy or overlap displacement). Ideally, no displacement exists between the first and second patterns, with the result that for a line pattern, for example, the line pattern can be formed on the wafer in the form of a single seamless line. Actually, however, there exists a misalignment or a constricted pattern at a pattern joint and in order to form a micro-pattern properly by applying the double patterning technique, it is necessary that a displacement or the like between the first and second patterns be evaluated properly and the evaluation be fed back to the design data of semiconductor pattern and the manufacture process.

In the one-dimensional critical dimension measuring technique for a pattern carried out generally up to now, only a specified direction of an overlapping portion between the first pattern formed through the first exposure and the second pattern formed through the second exposure, for example, is measured and as a result, proper evaluation of an overlapping area expanding two-dimensionally is difficult to achieve.

On the other hand, the method for two-dimensionally evaluating an overlap as explained in Patent Literature 1 is very effective to evaluate a pattern extending across a plurality of layers but the evaluation of the profile of a first pattern concealed by the second exposure is difficult and besides, a technique for measuring a relative misalignment between the two is not established sufficiently.

Sample measurement method and device will be described hereunder which, even when part of a pattern formed through a first exposure is concealed by a pattern formed through a second exposure, can measure properly a positional misalignment between the first pattern and the second pattern or which aims at making an evaluation of the profile of a concealed portion.

Solution to Problem

A method for measuring a sample is proposed which comprises, for the sake of measuring a misalignment between a first pattern and a second pattern, a step of forming a first image illustrative of the first pattern formed on the basis of a first exposure of double patterning with the help of a reduced projection exposure apparatus, a step of combining information concerning the first pattern and design information of the second pattern formed through the second exposure of double patterning to thereby form combined information, a step of forming a second image illustrative of the first and second patterns formed through the first and second exposures, a step of performing first pattern matching between the information concerning first pattern indicated in the combined information and the first pattern illustrated in the second image to thereby obtain first positional information of design information of the second pattern, a step of performing second pattern matching between the design information of second pattern indicated in the combined information and the information concerning the second pattern illustrated in the second image to thereby obtain second positional information of design information of the second pattern, and a step of determining a displacement between the two pieces of positional information on the basis of the two pieces of positional information, and a device for realizing the above method is proposed.

Further, in the second place, a sample measuring method is proposed which comprises a step of performing overlap between the first pattern illustrated in the second image and the first pattern information illustrated in the first image to thereby extract information concerning an overlapping area between the first and second patterns, and a device therefor is proposed.

Advantageous Effects of Invention

According to the above first constitution, a relative positional displacement between the two patterns formed by double patterning can be grasped quantitatively. Further, according to the above second constitution, an area of an overlapping portion can be extracted by using information based on the image preceding the formation of the second pattern and therefore, an overlapping portion between the unseen first pattern concealed by the second pattern and the second pattern can be evaluated.

DESCRIPTION OF EMBODIMENTS

Figure 1:
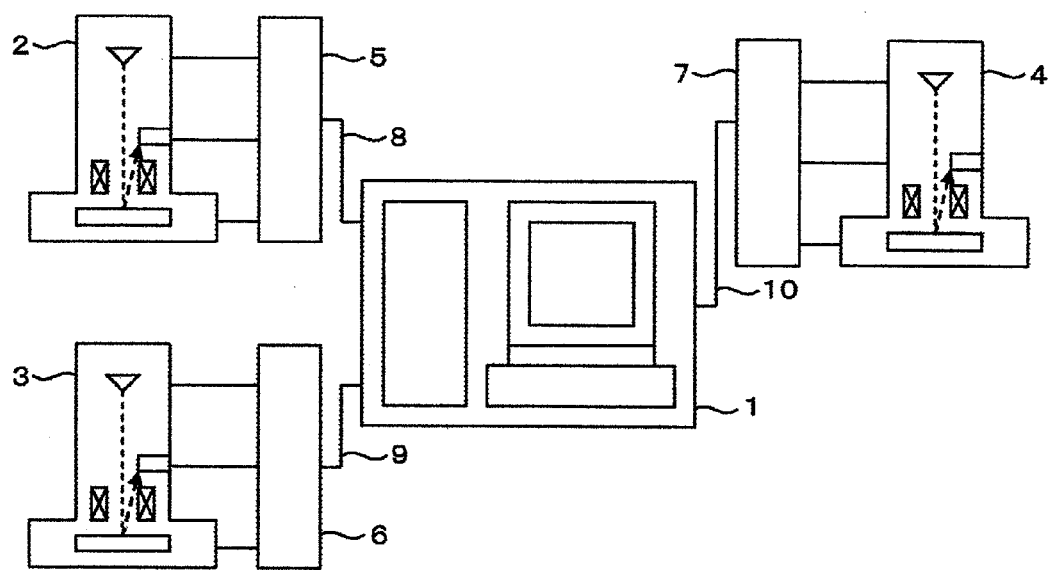
FIG. 1 is a diagram for explaining an example of a semiconductor measurement system connected with a plurality of SEM's.

In order to properly evaluate a displacement and an overlap portion between patterns formed by double patterning, a status of a joint portion needs to be grasped. More particularly, if the correlation of overlap status represented by an amount of overlap in design and an overlap between patterns formed actually on a wafer can be grasped and the relation between the two can be grasped in terms of a model expression, design data useful for necessary pattern formation can be prepared on the basis of information indicative of the grasped model expression.

Alternatively, by applying the information at the time of circuit design, a circuit design of wider process margin can be realized. It is indispensable for this end to indicate a phenomenon at a pattern joint portion quantitatively and indicate it by a numerical value which can be decided objectively.

In a standard measurement method (hereinafter referred to as 1D measurement), on the other hand, the one-dimensional length measurement in X or Y direction prevails mainly and for quantitative determination of a two-dimensional pattern, for example, a rounded profile of a line end or a corner portion of a L-letter curved pattern, a different means needs to be considered. Accordingly, it is predicted that quantitative determination of a joint portion, where the first pattern overlaps the second pattern in the double patterning process, with the help of the 1 D measurement is very difficult or its tendency can be indicated roughly from the measurement result at the most.

But, the image resolution accuracy demanded for such a device as using the double patterning process is asked for in a very difficult condition in excess of the limit of lithography and therefore, critical dimensional measurement or a measurement method capable of expressing the phenomenon of lithography with more fidelity is considered to be necessary.

In the following embodiments, a measurement method principally having the following (1) to (8) steps and a device and algorithm for realization of the method will be described.

(1) Resist or etching image data of a first pattern is acquired.

(2) On the basis of the data acquired in (1), a contour of the first pattern is extracted.

(3) Synthesized data of the contour data extracted in (1) and design data of a second pattern is outputted.

(4) Processing of the second pattern (second exposure) is executed.

(5) To a final pattern image illustrative of overlap of the first and second patterns, the resultant data having contour data of the first pattern and the design data or contour data of the second pattern which are synthesized (combined) in (3) is matched. In this phase, matching is performed in respect of each of the first and second patterns.

(6) The difference (Δx, Δy) between the two kinds of positional information obtained in the two-step matching in (5) is defined as an overlap displacement between the first and second patterns.

(7) An overlapping portion between the first and second patterns developing during execution of the respective matching operations in (5) is visualized by using the first contour data and an image of the second pattern and its area is calculated.

(8) With the above two parameters, the phenomenon of the double patterning process can be determined quantitatively and the process can be evaluated. Of the formation of the image of the aforementioned final pattern (in which the second pattern is formed on the first pattern) and preparation of data of the synthesized contour data and design data of the second pattern, any one may precede the other.

By quantitatively determining the pattern prepared through the double patterning process and its overlapping portion in this manner, data effective for the process condition and design consideration can be obtained. Further, a database obtained through the above measurement can be parameters which permit process-like or design-like modeling to be set up.

Through the above method, the amount of displacement of overlap between the first and second patterns can be indicated numerically and besides, visualization of the overlapping portion and calculation of its area value can be achieved. This ensures that the double patterning process can be evaluated quantitatively and objective decision and control can be attained.

A method for realizing the quantitative evaluation of a pattern formed by the double patterning and a device and system for realizing it will be described with reference to the drawings.

FIG. 1 is a diagram for explaining an example of a system for extracting a contour from a pattern on a scanning electron microscope image (hereinafter sometimes referred to as an SEM image). The following will give a description of the example as using the scanning electron microscope: SEM as an embodiment of a charged particle beam apparatus but this is not limitative and, for example, a focused ion beam: FIB apparatus for forming an image by scanning an ion beam on a sample may be adopted as the charged particle beam apparatus. But, for the purpose of selectively scanning an edge portion of a pattern advanced in miniaturization, a very high magnification is required and hence, the SEM generally superior to the FIB apparatus in point of resolution may preferably be used.

Illustrated in FIG. 1 is the example where a plurality of SEM's are connected concentrically to a data management unit 1. Individual SEM's 2, 3 and 4 are connected with controllers 5, 6 and 7, respectively, and control necessary for the SEM is carried out. In each SEM, an electron beam emitted from an electron source is focused by means of plural stages of lenses and the focused electron beam is scanned one-dimensionally or two-dimensionally on a sample by means of a scanning deflector.

Secondary electrons: SE's or backscattered electrons: BSE's given off from the sample under scanning of the electron beam are detected by a detector and then, stored in a storage medium such as a frame memory in synchronism with scanning by the scanning deflector.

The scanning by the scanning deflector is possible in respect of arbitrary magnitude, position and direction to make possible the scanning for forming images to be described later and the selective scanning to edge portions.

The control and the like described as above are conducted by the controllers 5, 6 and 7 of the individual SEM's, so that images and signals obtained as a result of the scanning of the electron beam are sent to the data management unit 1 via communication lines 8, 9 and 10. It will be appreciated that while in the present example the controller for controlling the SEM is explained as being separate from the data management unit for measurement on the basis of signals obtained by the SEM, this is not limitative and the apparatus control and the measurement processing may be conducted collectively in the data management unit, or the control of SEM and the measurement processing as well may be conducted in each controller.

Then, a program for executing a measurement process is stored in the data management unit or controller (hereinafter, sometimes referred to as an image processor) and a measurement is carried out in accordance with the program. Further, stored in a design data management unit are a photo-mask used for semiconductor manufacture process (hereinafter sometimes simply referred to as a mask) and design data of a wafer. The design data is expressed by, for example, GDS format or OASIS format so as to be stored in a predetermined format. The kind of the design data does not matter as far as the software for displaying the design data can display the format and can handle the design data as figure data. Alternatively, the design data may be stored in advance in a storage medium provided independently of the data management unit.

Figure 2:
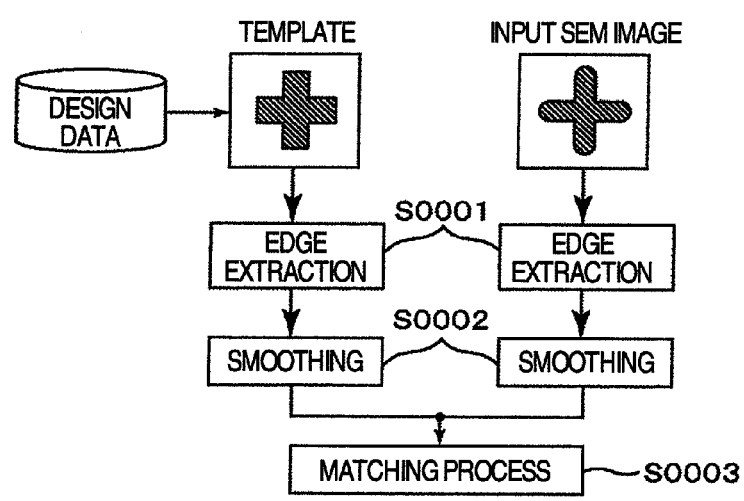
FIG. 2 is a diagram for explaining flow of a process of pattern matching between an SEM image and design data.

Further, the data management unit and the like has the function to perform pattern matching between figure data based on the design data and either an SEM image obtained with the scanning electron microscope or a contour formed on the basis of the SEM image. For example, in the case of pattern matching between the SEM image and the design data, an edge extraction process (S0001) is applied to a template extracted from the design data and to the SEM image, respectively, a smoothing process (S0002) is thereafter applied to the two to complement a profile difference between the two and a matching process (S0003) is eventually carried out, as shown in FIG. 2. Of course, matching may be performed between pieces of vector data. Putting the above aside, another existing matching method can also be applied.

Figure 3:
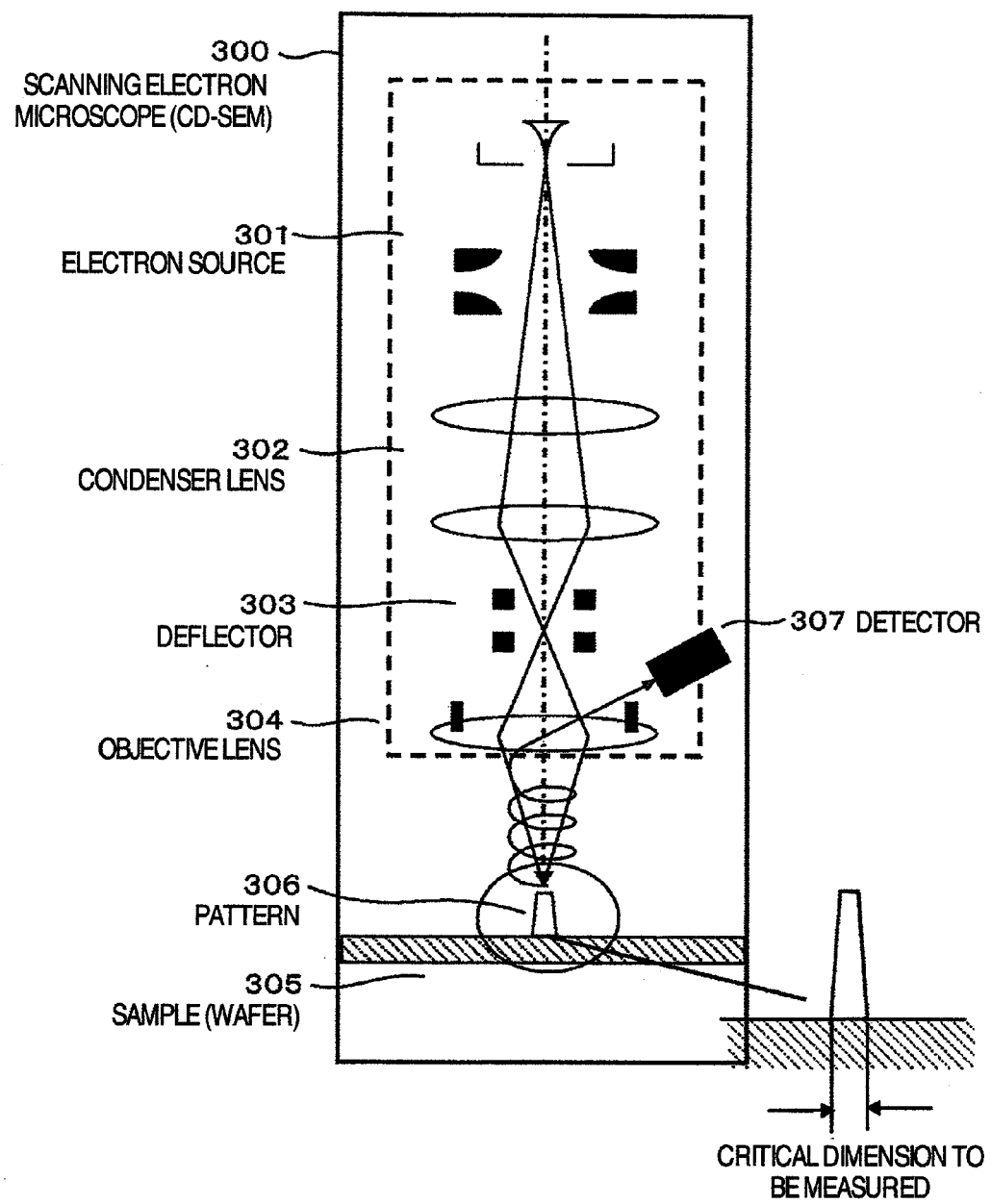
FIG. 3 is a diagram for explaining the outline of a critical dimension-scanning electron microscope.

FIG. 3 is a diagram for explaining the outline of a critical dimension scanning electron microscope (critical dimension-SEM: CD-SEM) representing a kind of SEM.

The CD-SEM is used after a lithography process being one of semiconductor manufacture processes to confirm sizes of various patterns transcribed onto a wafer. The CD-SEM 300 includes an electron source 301 for emitting an electron beam, a condenser lens 302 for converging the electron beam, a deflector (deflection coil) 303 for bending the electron beam to cause it to scan a wafer (sample) 305, an objective lens 304 for irradiating the electron beam on a micro-pattern 306 on the silicon wafer 305 and a detector 307 for detecting secondary electrons or reflection electrons given off from the micro-pattern 306.

In the CD-SEM constructed as above, a size of the micro-pattern 306 transcribed on the silicon wafer 305 can be measured under scanning of the electron beam and by executing a recipe for managing a critical dimensional point or a wafer map, automatic critical dimensional measurement can be executed. The measurement data is utilized for evaluation of device manufacture conditions and process control and especially, in evaluation of the device manufacture conditions, measurement is carried out up to points of several thousands so as to output pieces of data.

In case image acquisition and critical dimensional measurement are executed with the aforementioned CD-SEM, matching of an actual pattern image on a wafer to a precedently registered SEM image and design data is executed to recognize/identify a location. At that time, such data indicative of a correlation between the design data and the pattern on wafer as represented by an overlap image of design data on the SEM image can be outputted.

The measurement method for evaluating the critical dimensional data with the CD-SEM is important and standard as a method for evaluating lithography and the CD-SEM is an apparatus used the most generally for evaluation in novel lithography techniques.

Next, a double patterning process being now developed and evaluated as an up to date novel lithography technique will be described. The process corresponds to one of super-resolution techniques, providing a method for raising the resolution limit of exposure apparatus.

Figure 4:
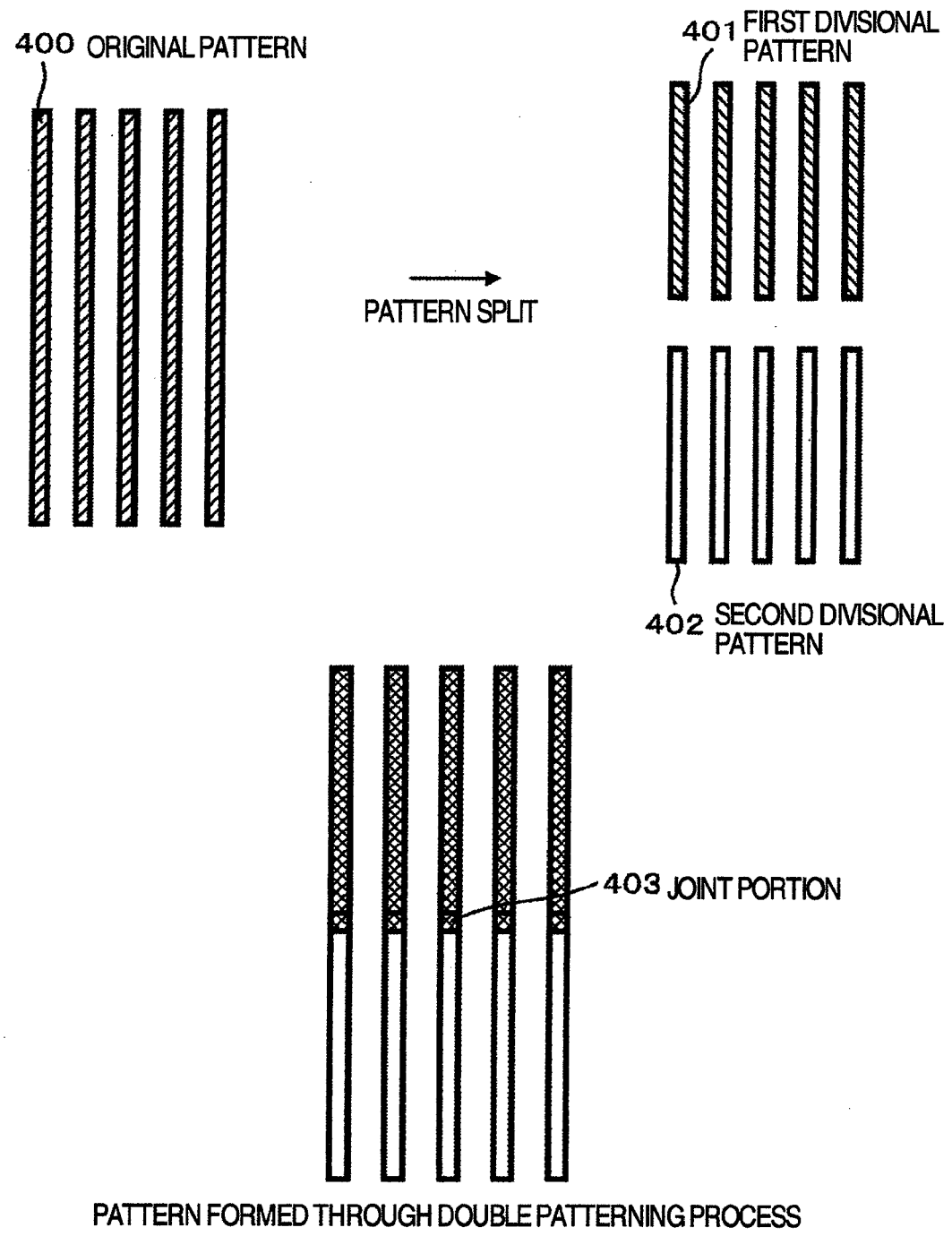
FIG. 4 is a diagram for explaining the outline of processes through which a pattern is formed by the double patterning method.

FIG. 4 is a diagram for explaining the outline of processes through which a pattern is formed pursuant to the double patterning method.

Firstly, an original design 400 representative of an original pattern is divided into two (or two or more) of a first pattern 401 and a second pattern 402. In respect of the thus divided design data, the pattern data is expanded in relation to each other so that connection portions of patterns resulting from the double patterning may be connected properly, thus forming joint portions 403. By executing exposure with the use of a photo-mask formed on the basis of the design data as above, a pattern illustrated at lower part of FIG. 4 can be formed. By performing divisional exposure of the pattern in this manner, a pattern can be formed in excess of the resolution limit of an optical exposure apparatus (sometime termed a stepper hereinafter).

In the division method as illustrated in FIG. 4, however, the status of formation of joint portion 403 will sometimes change depending on properness of the pattern expansion executed on the design data or a variation in the optical condition in the stepper. Depending on what formation status the joint portion 403 has, a fear of disconnection between the patterns arises and so evaluation of the joint portion is especially important.

In addition to executing the evaluation simply, the evaluation method is required of quantitative determination for the sake of making objective evaluation of the process conditions and the design data. Especially when the process condition and the design size are changed, it is indispensably necessary for the quantitative determination to exceed a predetermined level in order to perform relative comparison between the conditions before and after a change.

An evaluation method especially suitable for evaluation of a joint portion of patterns formed through double patterning and a device for realizing it will be described hereunder.
Embodiment 1

As shown in FIG. 4, through twice pattern formation processes, a joint portion 403 where a pattern (first pattern 401) overlaps on a pattern (second pattern 402) is formed. Ideally, it is preferable that such phenomena as a displacement and a deformation of the overlapping pattern at the joint portion do not at all occur but actually, the displacement and deformation sometimes develop. As evaluation items for evaluating such conditions quantitatively, (1) a displacement of overlapping pattern and (2) a deformation of pattern at the joint portion are available.

A method for evaluating these evaluation items will be described below.

Figure 5:
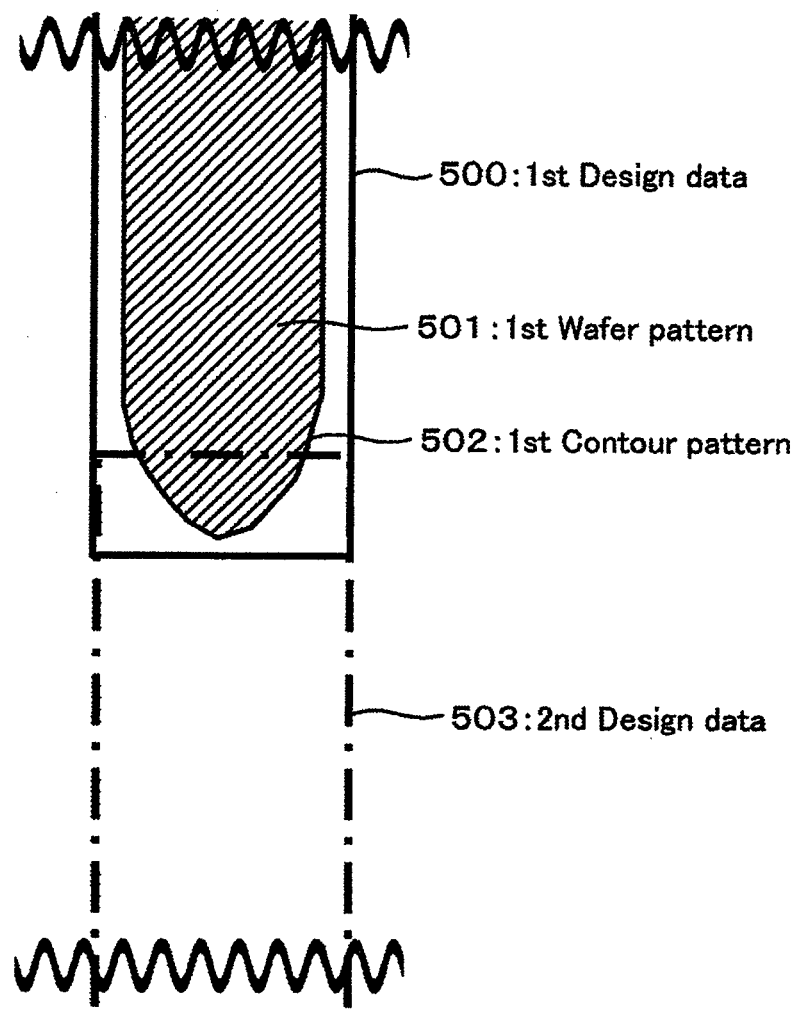
FIG. 5 is a diagram for explaining an example where a pattern formed when a first exposure of double patterning is carried out is overlapping on design data of the pattern.

FIG. 5 is a diagram for explaining an example where a figure expression (simply referred to as design data) stored in the design data (for example, GDS file data) overlaps a pattern formed when a first one of twice exposures through double patterning is carried out.

In the following description, the pattern formed by a first exposure and the pattern formed subsequently through the double patterning will be described as being a first pattern and a second pattern, respectively. As shown in FIG. 5, after the first pattern 501 (first wafer pattern) has been formed, an SEM image is acquired in respect of the first pattern 501. Next, SEM images expressing the first design data 500 and the first pattern 501, respectively, are moved in a direction in which the relative positional displacement between them reduces and then overlapping with each other. On the basis of the overlap, first contour data 502 (first contour pattern) is formed.

The contour data is formed by extracting, from an SEM image indicative of a white band formed at, for example, an edge portion of the pattern, a brightness distribution of the white pattern, by extracting positions exhibiting a predetermined brightness level in connection with the brightness distribution and by linking the positions together along the pattern edge. Putting the above method aside, another existing contouring technique can be applicable. To contouring, a contouring technology described in, for example, JP-A-2006-66478 (corresponding to US 2006/0045326) or WO2007/099439 can be applied.

By converting the thus obtained first contour data 502 into GDS which can link to the original design data, composite information as shown in FIG. 3 can be obtained. Through the working as above, the correlation among the first design data 500, first SEM image 501, first contour data 502 and second design data 503 can be clarified.

Figure 6:
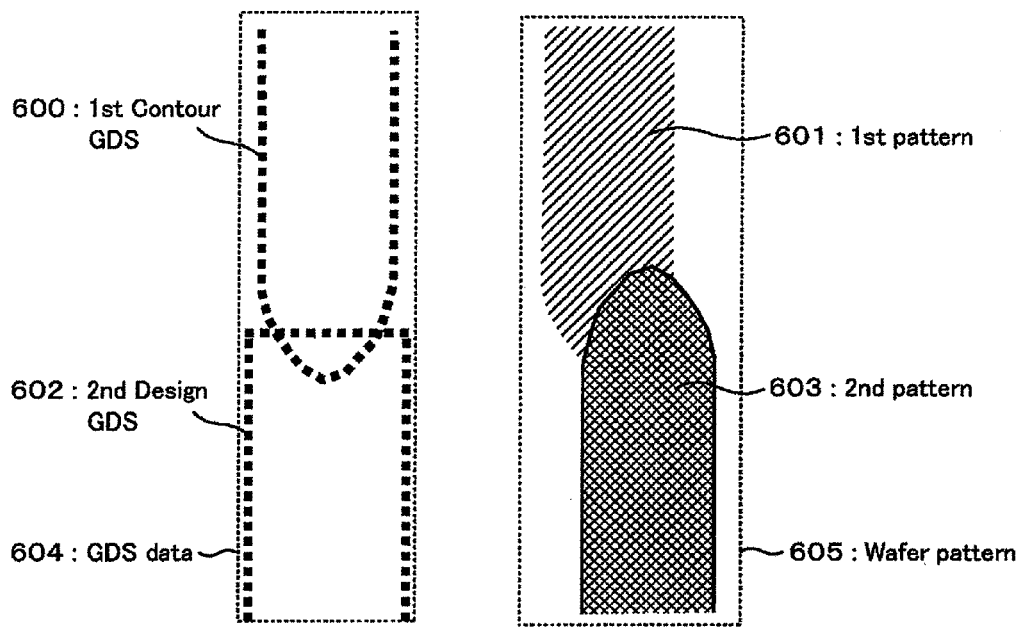
FIG. 6 is a diagram for explaining the outline of two pieces of data prepared in advance of execution of two-step matching.

In the pattern formed on the wafer by applying exposure based on the double patterning method, a first pattern 601 and a second pattern 603 will sometimes be formed with a relative displacement as shown on right side in FIG. 6, for example. Even when the first design data 500 and the second design data are for patterns which are essentially linked with each other linearly as shown in FIG. 5, they will sometimes be formed undergoing a displacement from each other as shown at the right drawing in FIG. 6 owing to a displacement of overlap between the first and second exposures, a pattern deformation or the like factor.

The linear pattern is exemplified in FIG. 6 but when a non-linear pattern (an irregular pattern as represented by logic device) is formed through double patterning, the amount of displacement becomes more difficult to identify.

Then, in the present embodiment, by using composite data, that is, GDS data 604, of a contour 600 of first pattern converted into GDS and second design data 602, the second exposure by the optical exposure apparatus is carried out and by using an SEM image 605 having a second pattern 603 formed on a first pattern 601, an mount of displacement between the first and second patterns is calculated, as shown in FIG. 6.

At that time, by performing two steps of matching by changing the target, its displacement is calculated.

While in the present embodiment the GDS data combining the contour of first pattern with the design data of second pattern is the target of matching, this is not limitative and for example, contour data of second pattern may be used in place of the design data of second pattern. Three of SEM image (pattern image), contour data and design data can be acquired in connection with each of the first and second patterns but the target of combination can be changed as necessary.

In the present embodiment, two stages of matching proceed between the SEM image (or contour data formed on the basis of the SEM image) having the second pattern formed on the first pattern and expressing with high fidelity a displacement between the first and second patterns and the combined data of the contour data of first pattern and the design pattern of second pattern, expressing with high fidelity the profile of the first pattern and expressing the ideal positional relation to the first pattern, thereby identifying a displacement between them.

Figure 7:
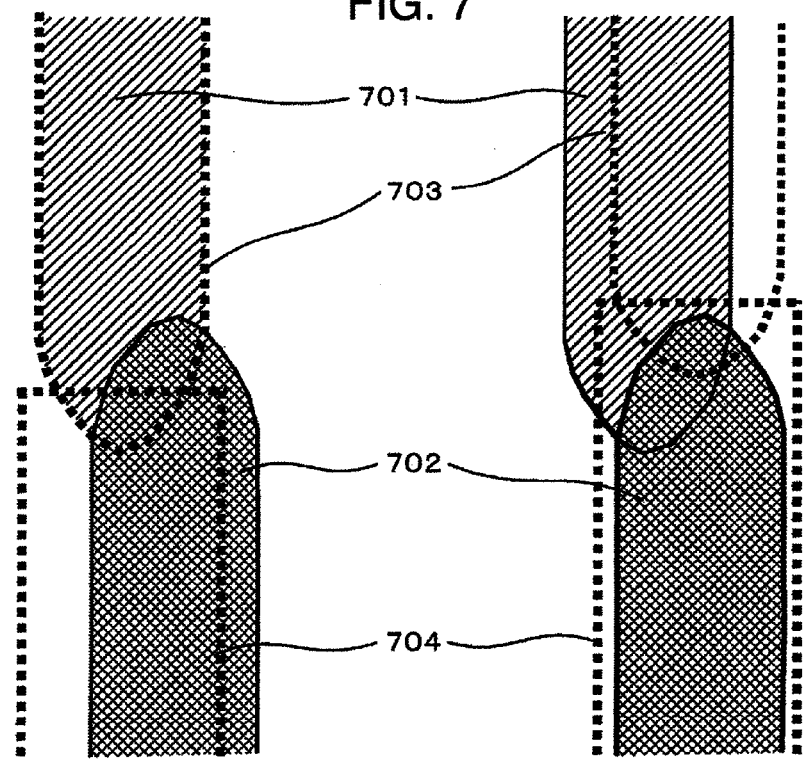
FIG. 7 is a diagram for explaining the outline of the two-step matching.

In a method exemplified in FIG. 7, in respect of an SEM image illustrative of a status of overlap of a second pattern 702 on a first pattern 701, matching is first conducted between the first pattern 701 of the SEM image and a contour 703 of the first pattern and the positional information is recorded (left drawing in FIG. 7). The contour 703 of first pattern is so conditioned as to be combined with design data 704 of second pattern and then, the positional information of the design data 704 at that time is memorized.

Figure 8:
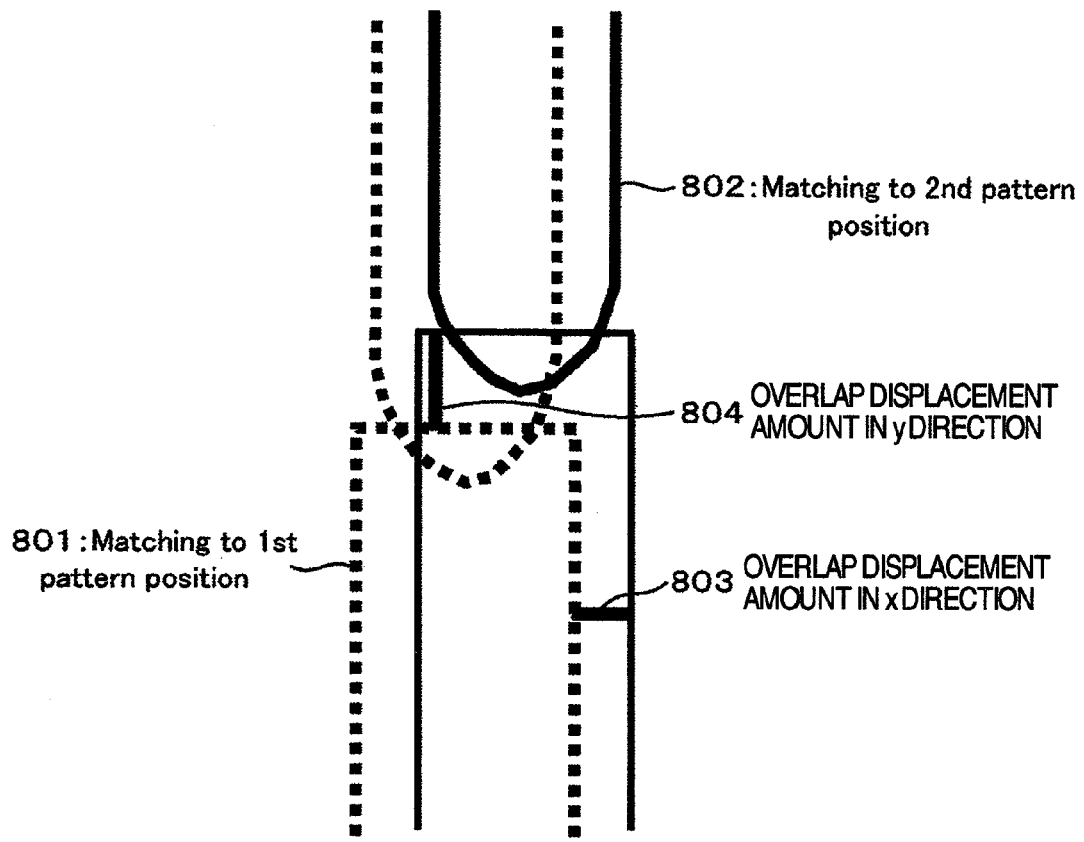
FIG. 8 is a diagram for explaining the outline of measurement of displacement amounts in X-Y directions based on the two-step matching.

Next, design data 704 (GDS data) of second pattern is matched to the second pattern 702 and its positional information is recorded (right drawing in FIG. 7). A moving amount (difference of positional information) of the design data 704 of second pattern obtained through the above twice matching operations can be defined as a displacement of the overlapping first and second patterns. As shown in FIG. 8, on the basis of two pieces of positional information obtained by first matching (matching position 801) using the design data of second pattern, an overlap displacement amount in X direction and an overlap displacement amount 804 in Y direction can be clarified.

In the above embodiment, since matching is effected by using an image of first pattern acquired in advance of the formation of the second pattern, a high matching accuracy and besides, correct evaluation of profile and area of an overlap portion to be described later can be realized.

From the standpoint of highly accurate evaluation of profile and area of the first pattern partly concealed by the second pattern, it is desirable to match the contour data of first pattern to the image data of first pattern and extract the profile information and area information but only for evaluating a displacement between the first and second patterns briefly, positional information of the design data of second pattern clarifying relative positional relation to the first design data may be acquired by performing matching between pieces of the first pattern and design data of first pattern and thereafter, matching between the second pattern and the design data of second pattern may be effected to thereby similarly obtain positional information of the design data of second pattern.

With the above construction, the displacement amount of pattern overlap (hereinafter termed overlap displacement amount) can be determined in terms of a numerical value.

It is to be noted that after the second pattern has been formed, part of the first pattern is concealed by the second pattern and becomes unseen. Under such a condition, the overlap displacement amount 804 in y direction cannot possibly be measured accurately in the case of measurement exemplified in, for example, FIG. 8. Therefore, the method exemplified in FIG. 8 for performing matching by using the image acquired in advance of formation of the second pattern can realize high measurement precision.

In addition, in the measurement and evaluation of the amount of a pattern deformation to be described later, too, overlapping the contour on the SEM image is important.

Figure 9:
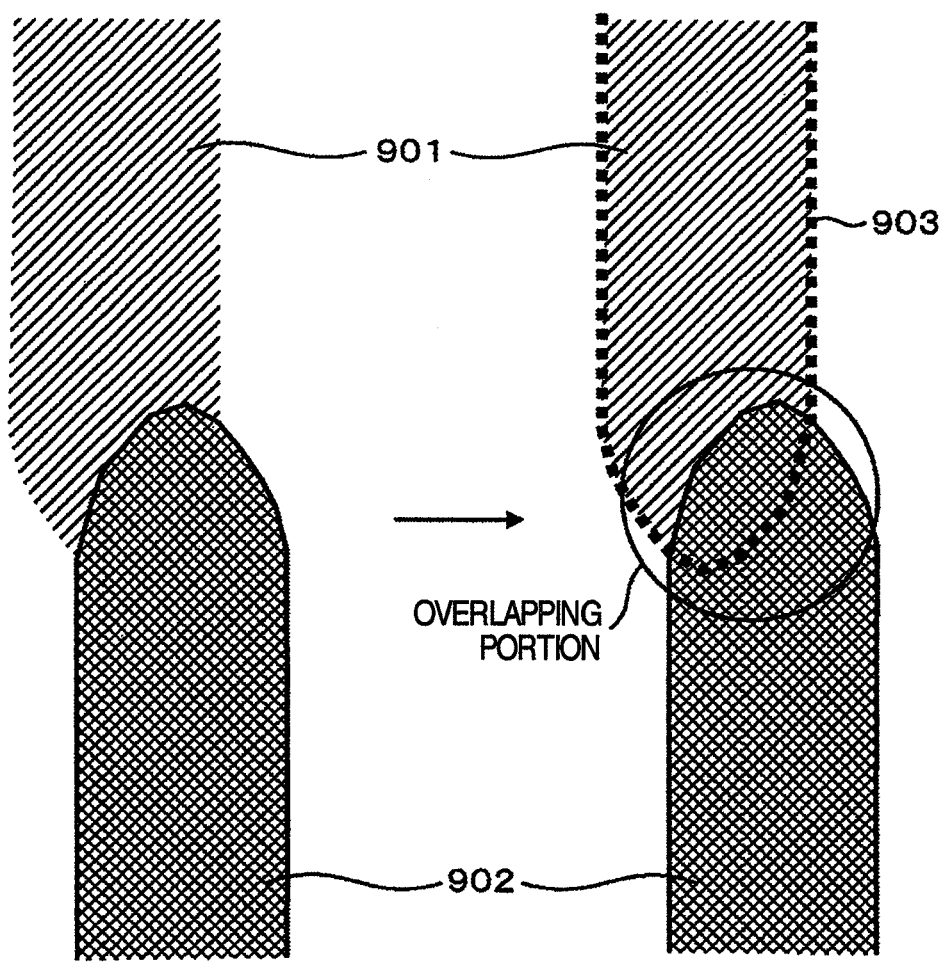
FIG. 9 is a diagram for explaining an example where a first pattern positioned under a second pattern is visualized.
Figure 10:
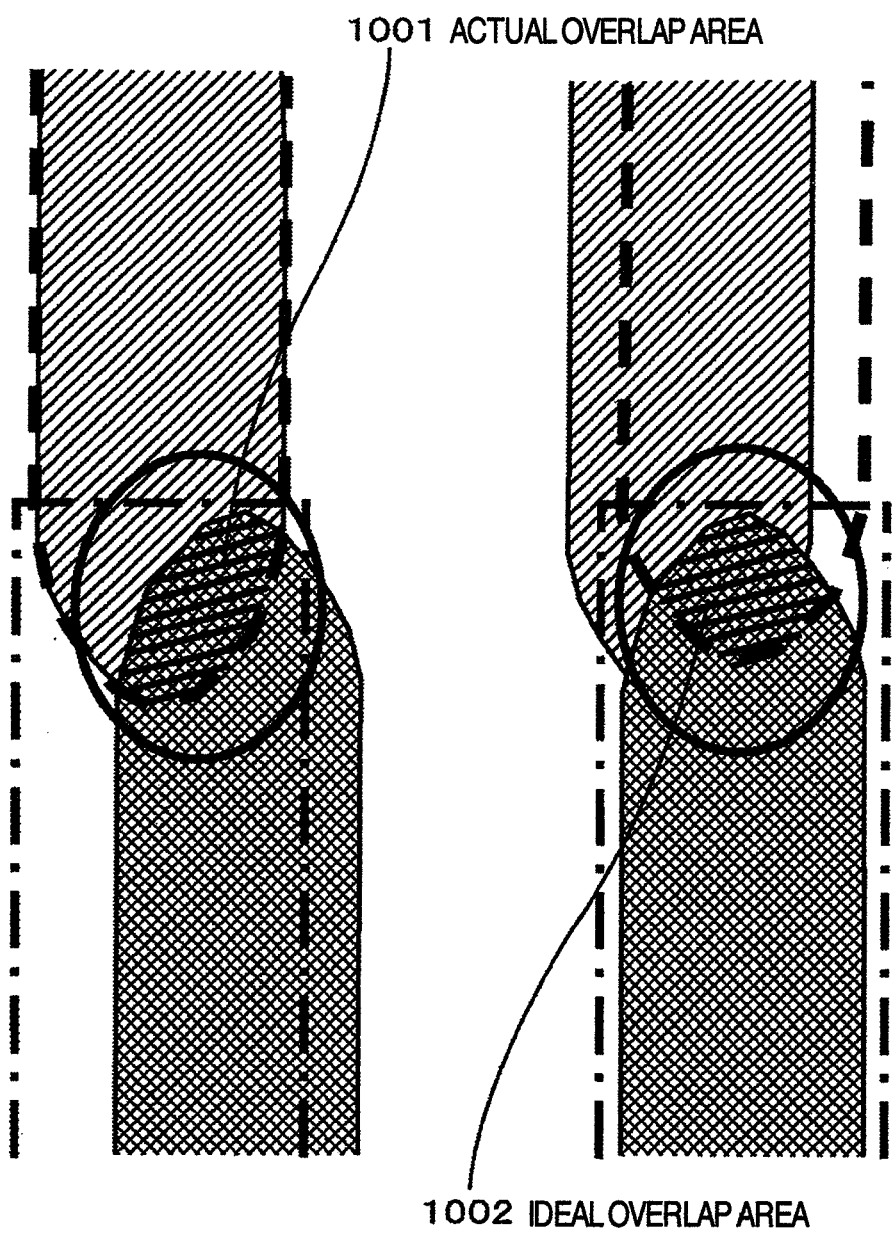
FIG. 10 is a diagram for explaining an example where an ideal overlapping area is calculated on the basis of the two-step matching.

As shown in FIG. 9, by overlapping a contour 903 of a first pattern 901 on the first pattern, the aforementioned part of first pattern 901 underlying the second pattern 902 and being unseen is visualized and an overlapping portion can be expressed clearly.

In the double patterning in which the pattern overlap occurs, an amount of overlap between the first and second patterns can be calculated quantitatively through the visualizing process, permitting the overlap amount to be utilized as a parameter for process evaluation or the like.

For the overlap portion, matching to each of the first and second patterns is executed as shown in FIG. 7 and on the basis of a second step of matching, a virtually ideal area (area of an ideal overlap area 1002) is calculated. In the second step of matching, an ideal overlap area value free from a relative displacement between the first and second patterns can be determined. This value in which information of inter-pattern displacement is erased from an actual overlap status can therefore be suitable for quantitative evaluation of the degree of pattern deformation and the pattern profile.

In the first step of matching, an actual overlap area (an area of actual overlap area 1001) can be evaluated.

Strictly speaking, there is a possibility that the profile changes as the overlap position differs and conceivably, the area value differs from that calculated when a pattern in ideal condition is obtained actually and so, capturing of the two kinds of values from a single sample is considered to be a method effective for evaluation and the like.

Next, how to utilize the data measured through the above method will be described. The sequence shown in FIG. 11 indicates a series of flow of (1) measurement of an amount of displacement of overlap between first and second patterns, (2) calculation of an area of an overlapping portion and (3) process evaluation by comparison with the design size and the sample preparation condition, the flow being executed for a sample subject to double patterning.

Figure 11:
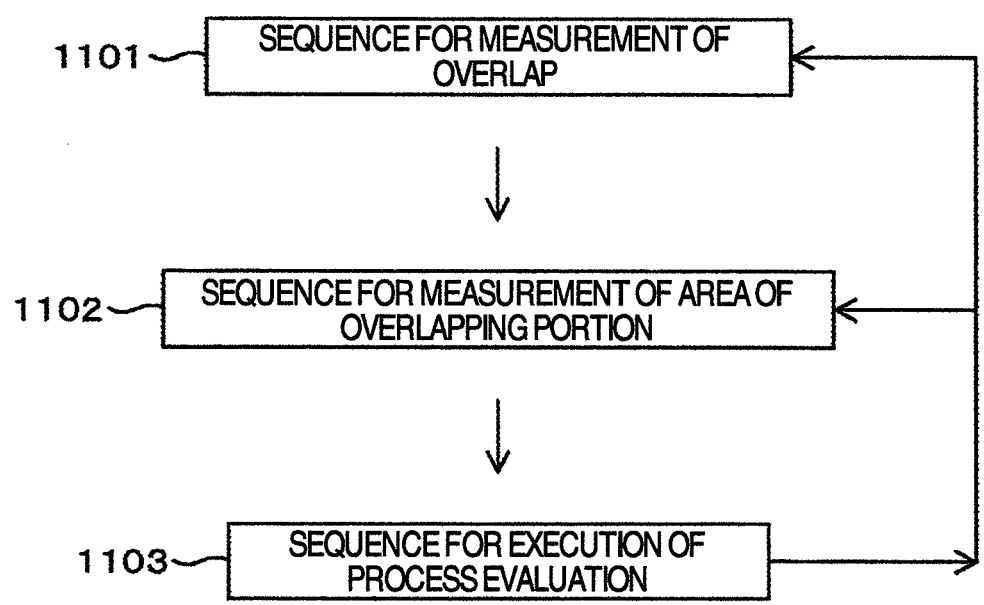
FIG. 11 is a diagram for explaining a process evaluation sequence when overlap displacement measurement and overlap area value calculation are carried out in the double patterning process.

More specifically, FIG. 11 shows a process evaluation sequence using the method for measurement of an overlap displacement and calculation of an overlap area value in the double patterning process and including measuring a displacement amount between first and second patterns in the double patterning (step 1101), calculating an area of an overlapping portion between the patterns (step 1102) and evaluating the double patterning process by using the measurement value and area value (hereinafter, simply referred to as evaluation values) determined in the steps 1101 and 1102 (step 1103).

Figure 12:
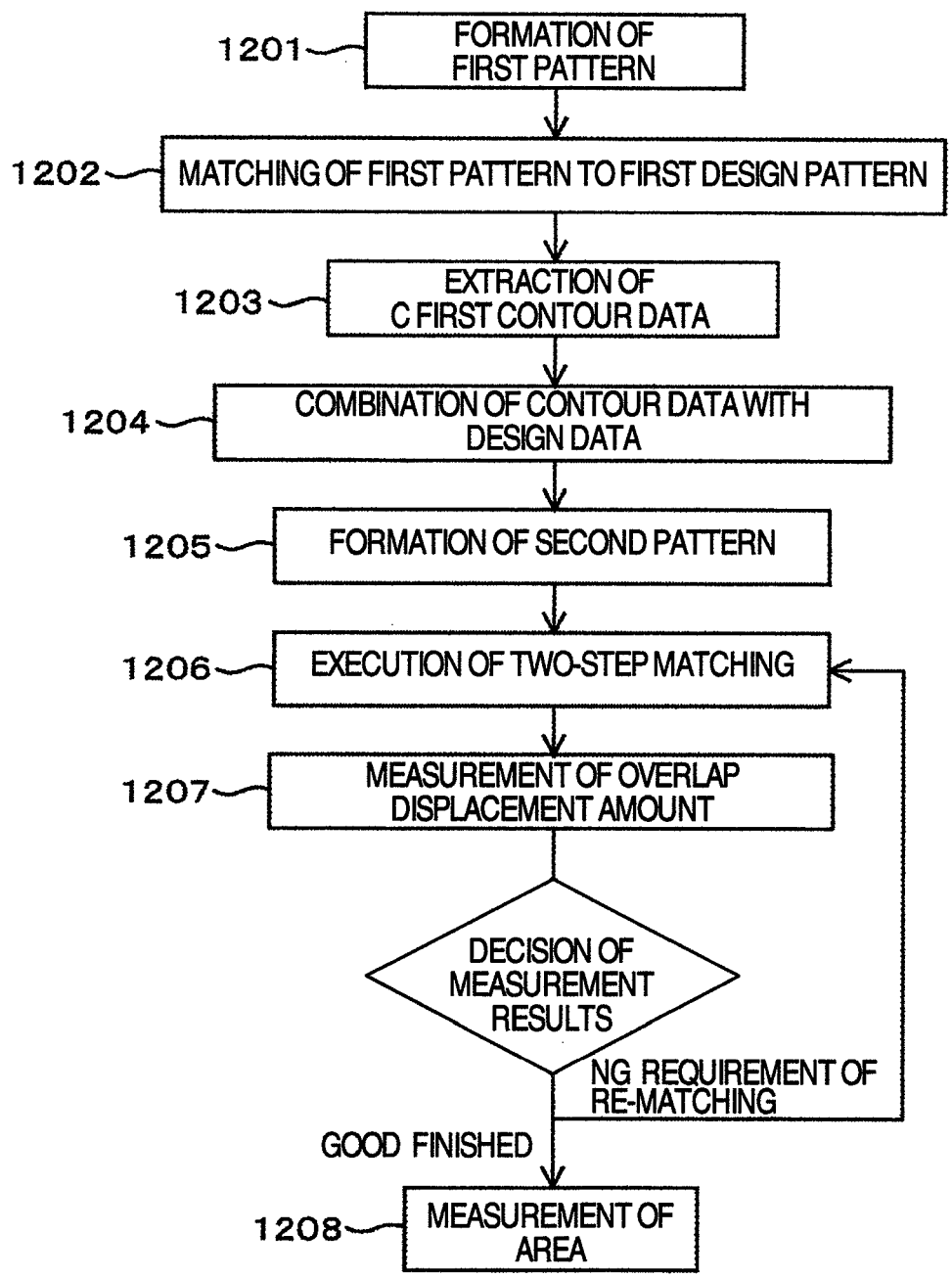
FIG. 12 is a flowchart for explaining details of an overlap measurement sequence.

FIG. 12 shows details of flow of a process in the step 1101 in FIG. 11. When a normalized value (for example, a matching score value) is set in the two-step matching at the time of overlap displacement amount measurement and a displacement from that value occurs, re-matching is determined in which the program returns to the step of two-step matching and then working can be repeated. Thereafter, the program proceeds to the sequence of area measurement.

More specifically, in FIG. 12 showing the flow useful to explain details of the overlap measurement sequence in FIG. 11, a second pattern and a divided first pattern are first formed on a wafer (step 1201). Subsequently, measurement (pattern matching, imaging, critical dimensioning of the first pattern) is carried out by the CD-SEM (step 1202).

Next, on the basis of the result of measurement, a contour of a SEM image is extracted (step 1203) and contour data of the first pattern is combined with design data (prepared in, for example, GDS format) (step 1204). The data is used in the succeeding two-step matching.

Next, a second pattern is formed on the wafer on which the first pattern is formed (step 1205). Matching is executed between the combined data prepared in the step 1204 and the SEM image of a sample formed with the second pattern (step 1206). This matching is called two-step matching for matching the combined GDS data to each of the first and second patterns.

Next, a difference between pieces of positional information of GDS resulting from the twice matching operations is determined which in turn is defined as an overlap displacement amount (misalignment) between the first and second patterns (step 1207). At that time, if the precision of matching of the combined GDS to the SEM image is problematic, re-matching is practiced to re-measure an overlap displacement amount. With acquisition of data ended, the program proceeds to an area measurement sequence (step 1208).

Figure 13:
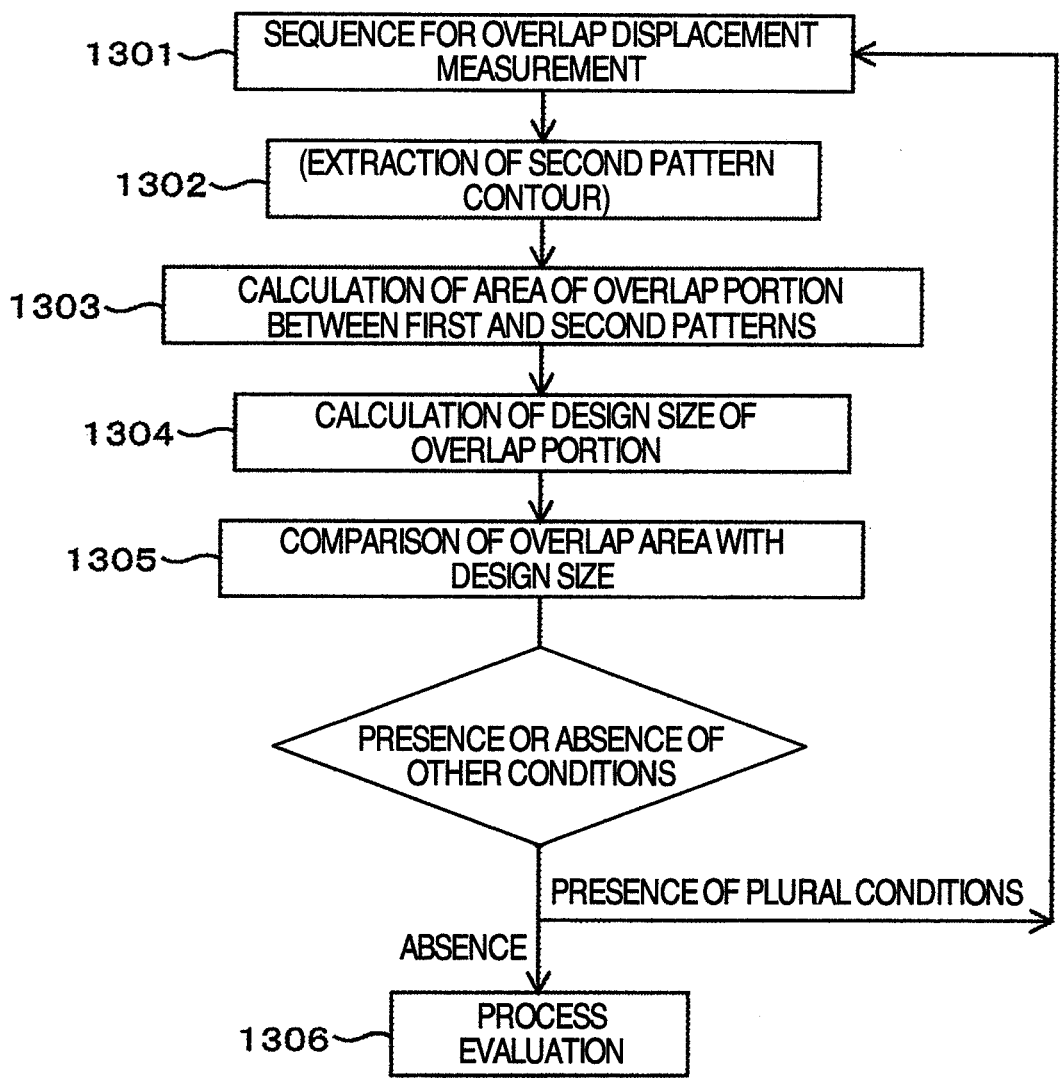
FIG. 13 is a flowchart for explaining flow of a specified process for performing area measurement.

FIG. 13 is a diagram for explaining flow of a particular process for performing area measurement. In the area measurement sequence, area measurement is conducted for a first contour on the basis of the second pattern or, as necessary, for the first contour on the basis of a second contour. When a plurality of conditions are present during sample preparation or a plurality of kinds of design size are present, processes covering steps from 1301 to 1305 are repeated by the number of conditions to thereby obtain data. After the measurement ends for all conditions, the program proceeds to a sequence of process evaluation on the basis of the data.

More specifically, FIG. 13 is useful to explain steps as below.

Firstly, the overlap displacement measurement sequence explained in connection with FIG. 12 is carried out (step 1301). Next, as necessary, extraction of a contour of the second pattern representing an upper layer pattern is carried out (step 1302). Next, a first contour is matched to the first pattern out of actual patterns prepared through double pattern process and an area of a portion overlapping the upper layer second pattern is measured (step 1303). Next, an overlap size and an area value on design data are calculated (step 1304). The overlap portion area obtained in the step 1303 is compared with the overlap portion area on design data obtained in the step 1304 and on the basis of a ratio or difference therebetween, a correlation is confirmed (step 1305). When a plurality of design sizes and a plurality of process conditions are present, the steps from 1301 to 1305 are repeated by the number of conditions and with necessary data acquisition ended, the program proceeds to the process evaluation sequence (step 1306).

After data of combined plural conditions have been obtained on the basis of the process conditions and the design size split, process windows are prepared for individual conditions or a process window (composite process window) representing a combination of the prepared process windows can be set up.

The process window can also be set up from, for example, a correlation of the overlap displacement amount to the area of overlapping portion. An evaluation method is conceivable in which the displacement amount measurement and area calculation are carried out newly by reflecting these results so as to determine design and process conditions and so as to model both the factors.

Figure 14:
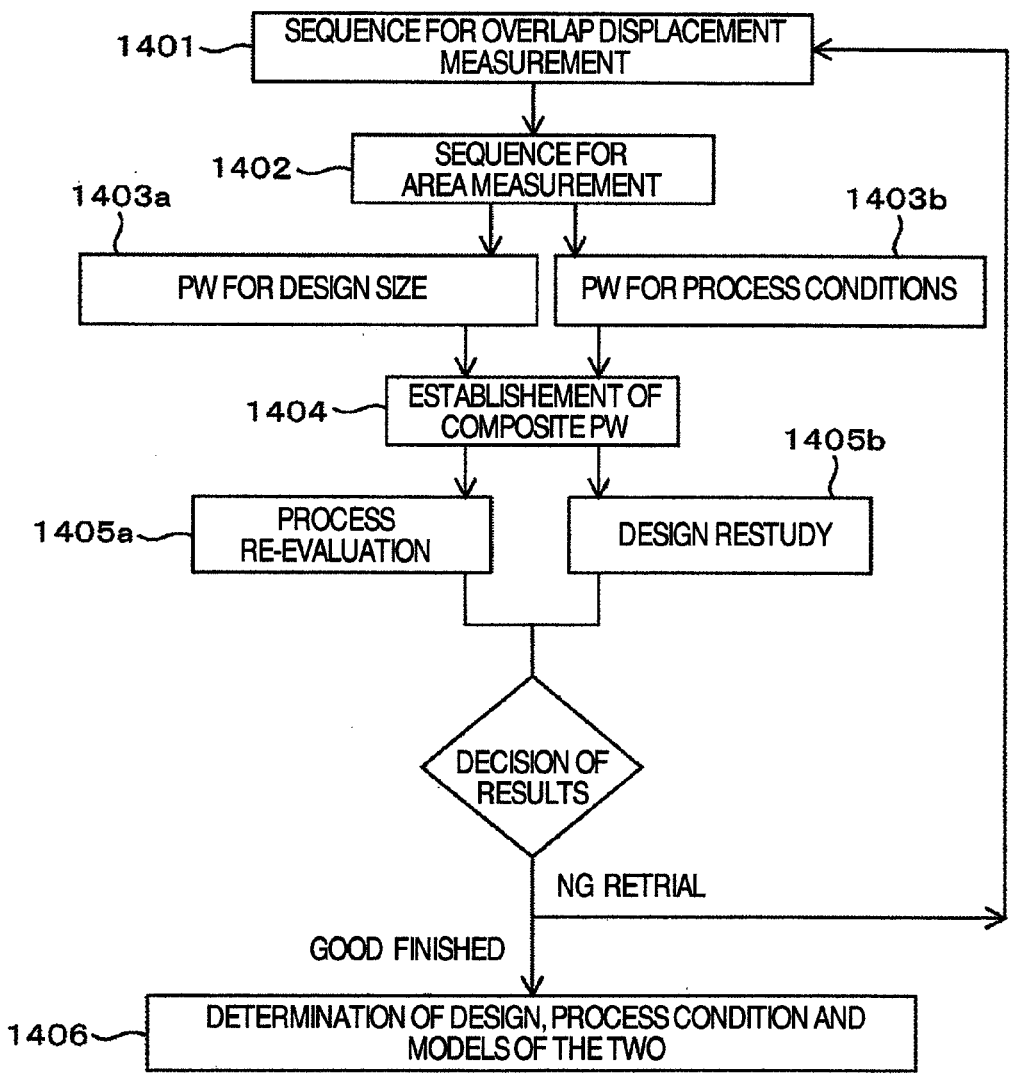
FIG. 14 is a diagram for explaining an example of a sequence for making an evaluation of a double patterning process from overlap displacement amount and area value.

FIG. 14 shows a diagram for explaining an example of sequence of performing double patterning process evaluation from the overlap displacement amount and the area value. Firstly, the sequence of overlap displacement measurement explained in connection with FIG. 12 and the like is carried out (step 1401). Next, the sequence of area measurement explained in connection with FIG. 13 and the like is carried out (step 1402). Next, a design size is compared with pieces of data obtained in the steps 1401 and 1402 to set up a process window (step 1403a) and besides, process conditions are compared with the pieces of data obtained in the steps 1401 and 1402 to set up a process window (step 1403b).

On the basis of the steps 1403a and 1403b, a composite process window is set up (step 1404). Next, on the basis of the thus set up composite process window, the process conditions are restudied (step 1405a) and besides, the design data is restudied (step 1405b).

On the basis of the result of aforementioned restudy of process conditions and the result of restudy of design data, design and process conditions are decided. A modeling of a combination of them is also set up.

By making the thus obtained displacement amount between the first and second patterns fill the role of a parameter in the process control of semiconductor process, the displacement amount can be utilized for product control at the time of device mass production to which the double patterning process is diverted.

Embodiment 2

A display format of data for properly evaluating evaluation values of an overlapping portion such as a displacement amount between first and second patterns, an area value of the overlapping portion, a critical dimensional value and so on which are obtained on the basis of an image formed by means of the SEM will be described hereunder.

Figure 15:
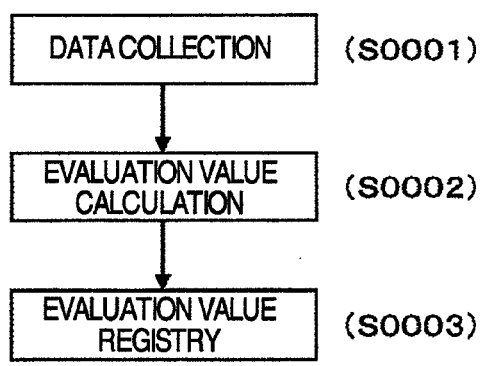
FIG. 15 is a flowchart for explaining flow of data process after acquisition of information concerning overlap between the first pattern and the second pattern.

FIG. 15 is a flowchart for explaining flow of a data process after information concerning an overlap between first and second patterns has been obtained.

Firstly, in data collecting step (step 0001), necessary information concerning an overlap between first and second patterns is collected. This information is indicative of a displacement between the first and second patterns, an area of overlap, a one-dimensional dimension value of overlapping portion and so on. Next, on the basis of the thus obtained data, an evaluation value for evaluating the overlap is calculated (step 0002). Available as an example of the evaluation value is a ratio between longitudinal and lateral dimensions of the overlapping portion (or a dimensional ratio between major and minor diameters). The evaluation value can also be data that can be calculated by comparing design data of a semiconductor pattern with data obtained on the basis of the SEM image. Exemplarily, available as such values are displacement between the patterns and overlap area as obtained on the basis of the design data of values determined in the step 1 and the SEM image, a comparative value (difference or ratio between two values) or a comparative value of the dimensional ratio determined in the step 0002. Various kinds of evaluation values can be applied to these evaluation values as explained in connection with embodiment 1.

Further, when profiles of overlapping portions may be classified profile by profile and a predetermined evaluation value may be given to a profile (for example, when the profile is categorized as a proper circle, a longitudinally elongated ellipse or a laterally elongated ellipse, "1", "2" or "3" is given).

Figures 16, 17:
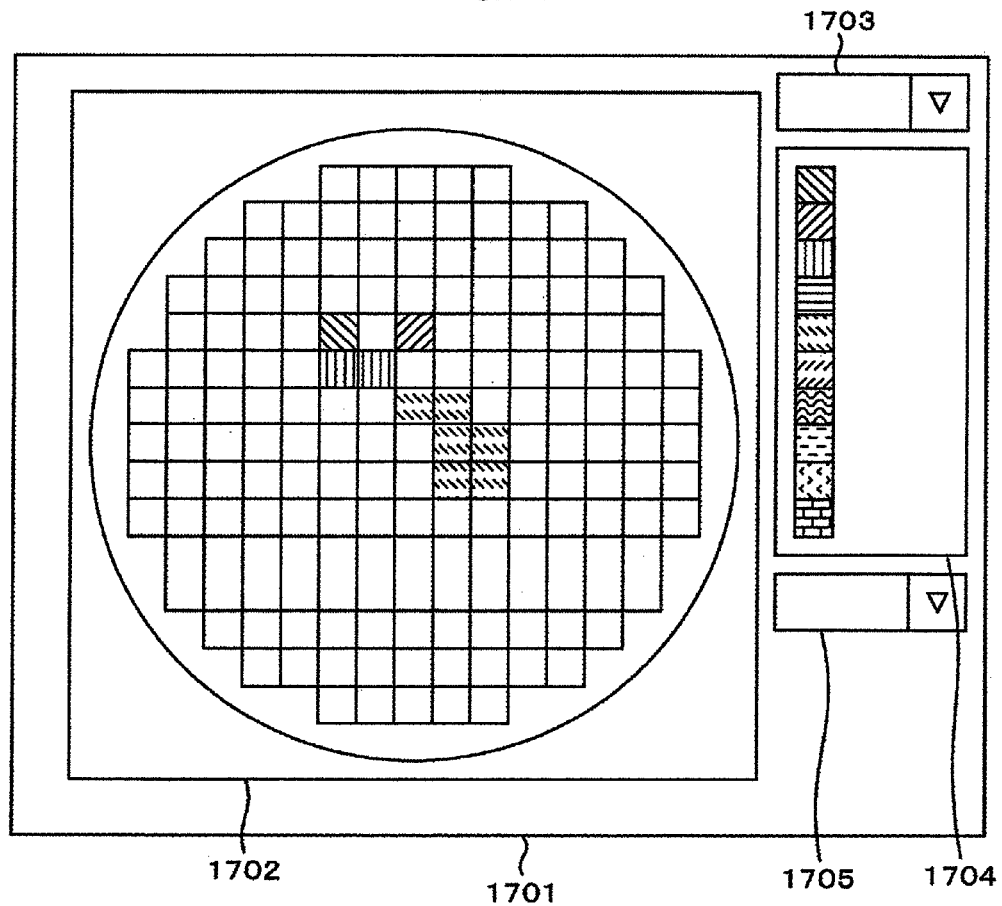
FIG. 16 is a diagram for explaining an example where the kind of a pattern and the evaluation value are stored by having relation to each other in respect of individual measurement positions.
FIG. 17 is a diagram for explaining an example of a wafer map display.

The results of measurement and operation as above are registered in table format as shown in FIG. 16. The kind of patterns and the evaluation values are memorized by having relation to each other in respect of individual measurement positions (overlap portions). In the example of FIG. 16, in respect of individual identification numbers (ID's) of measurement positions, the kind of patterns and the evaluation values are stored by having relation to each other. In the present embodiment, the kind of patterns is further sorted into two categories and their data pieces are memorized. Specifically, profiles of the first and second patterns and connection direction of the two patterns are taken. These pieces of information can be collected by making reference to the design data.

As illustrated in FIG. 16, the profiles of the two patterns are indicated in, for example, a column of "Obj" (object) by being expressed as "LE/LE" (any of the first and second patterns being present at a line end of a line pattern) or as "LE/LC" (the first pattern being present at a line end of a line pattern and the second pattern being present at a line corner of the line pattern). The relative positional relation between the first and second patterns is expressed in a column of RC (relation of connection). For example, "L/R" (left/right) indicates that a pattern has a first pattern arranged on the left side and a second pattern arranged on the right side and "T/B" (top/bottom) indicates that a pattern has a first pattern arranged above and a second pattern arranged below.

The reason for memorizing the kind of patterns and the identification information of patterns as described above is that the significance the obtained evaluation value has changes with the kind of pattern. For example, when for a pattern having both first and second patterns at line end, the connection portion of the first and second patterns is evaluated as a laterally elongated ellipse, it is suspected that if the patterns are in the "T/B" relation, the exposure position displaces to above the first pattern or to below the second pattern or both. On the other hand, if the patterns are in the "L/R relation, there is a possibility that in addition to the above and below displacement, displacements in the right and left directions are involved. In this manner, the two-dimensional information for the joint portion will sometimes have different meanings depending on the connection relation.

By making reference to the connection relation between the first and second patterns and the evaluation value by having relation to each other as described above, the cause of connection displacement or the like can be studied speedily.

Further, in the measurement result table shown in FIG. 16, a column of "DO" (dimension of overlap) indicative of an area of an overlap between the first and second patterns and a column of "AR" (aspect ratio) are involved. The "DO" indicates an area value of an overlap portion between the first and second patterns and the "AR" indicates a longitudinal/lateral ratio of an overlap portion. The "AR" need not always be an actual ratio but may be a value allotted in respect of each profile category. Indicated by "X-dis" (X-displacement) and "Y-dis" (Y-displacement) are displacements in X direction (lateral direction) and Y direction (longitudinal direction), respectively, and by "VEC" (Vector) is a direction of a displacement between the first and second patterns which is determined on the basis of displacements in X direction and Y direction.

By displaying these pieces of information in parallel with the kind of patterns, the cause and effect relation between the kind of pattern and the evaluation result and so on can be clarified.

Also, in the display format as shown in FIG. 16, it is preferable that evaluation values can further be displayed in accordance with the kind of patterns. For example, a target having the kind of patterns "LE/LE" may be displayed selectively or may be displayed selectively on a predetermined area on the table. Through the displays as above, evaluation values can be evaluated in respect of the kind of each pattern. Further, the "DO" and "AR", for example, may be rearranged in order of the magnitude of evaluation value (inclusive of increasing order or decreasing order). Through the display as above, the kind of a pattern having a large displacement can be identified easily. For example, when rearrangement in increasing order is effected and the kind of special patterns concentrate in higher order, the presence of a failure factor particularly depending on the profile can be presumed. Especially, a failure factor which depends on the profile is considered attributable to the semiconductor design and therefore, by taking into account the evaluation results rearranged in order of magnitude, the design data correction and the photomask correction can be dealt with so as to be executed speedily.

Further, in the table shown in FIG. 16, such items as an ideal value of overlap portion (area of an overlap portion on design data, "DD"), a process name of semiconductor process ("PF" (process flow) and a ratio between ideal value and actual measurement value (evaluation value) ("RDA") of the overlap portion may be arranged and they may be displayed. Then, the above ideal value may be an area value obtained after an actual profile of a pattern has been simulated. For these items, the aforementioned classification kind by kind may be made possible.

As described above, by comparing the two dimensional information of an overlap portion between the first and second patterns with different pieces of information associated with the overlap portion, the meaning the evaluation value of the overlap portion has can be specified speedily and as a result, better feedback of the quantitative evaluation of semiconductor process and the semiconductor process based thereon can be made possible.

FIG. 17 is a diagram for explaining an example where evaluation results are displayed in the form of wafer map. Arranged on a screen 1701 are a wafer map display portion 1702 resembling a wafer, a selection region 1703 for selection of a desired evaluation value, a display region 1704 for display of a numerical value range to which the evaluation value belongs and an input region 1705 for input of the kind of a pattern. According to this display format, a cause of overlap displacement can be identified easily by making a decision as to whether the cause is attributable to a cause on the side of the wafer such as a warp of the wafer, to a problem of positioning accuracy of the exposure apparatus, to a problem the design data causes and the like. For example, when equivalent pattern kind is selected and a large displacement amount is then detected allover the wafer, it can be seen that a cause of displacement will depend on the kind of pattern and the essential cause will possibly originate from the design data. Otherwise, if a displacement takes place selectively in only a particular chip, it is considered that at least the design data does not matter but a displacement of exposure positions between first and second exposures will be responsible.

By taking the distributive display of evaluation values as above, the cause of overlap displacement can be identified with ease. Putting the display in the wafer map format aside, evaluation values may be displayed on distribution in, for example, a chip unit of semiconductor wafer or a shot unit of optical exposure apparatus.

REFERENCE SIGNS LIST

1 Data management unit
2, 3, 4 SEM
5, 6, 7 Controller
8, 9, 10 Communication line
300 CD-SEM
301 Electron source
302 Condenser lens
303 Deflector
304 Objective lens
305 Silicon wafer
306 Micro-pattern
307 Detector

The invention claimed is:

1. A method for measuring a sample by scanning a charged particle beam on the sample and measuring a pattern formed on the sample on the basis of charged particles given off from the sample, comprising the steps of:

forming a first image of a first pattern formed by a first exposure of double patterning using a reduced projection exposure apparatus;

combining information concerning the formed first pattern based on the first image and design information of a second pattern to be formed by a second exposure of the double patterning to thereby form a combined information template, the first image being of the formed first pattern prior to formation of the second pattern and not including the second pattern;

forming a second image of the first and second patterns formed by said first and second exposures, respectively;

performing a first pattern matching between the information concerning the formed first pattern in said combined information template and the first pattern in the second image to thereby obtain a first position of the design information of said second pattern;

performing a second matching between the design information of the second pattern in said combined information template and information concerning the second pattern in said second image to thereby obtain a second position for the design information of said second pattern; and determining a displacement between the first and second positions.

2. A sample measuring method according to claim 1, wherein the information concerning said first pattern is information indicative of a contour of the first pattern extracted from said first image of said first pattern.

3. A sample measuring method according to claim 2, wherein said combined information template is formed by combining the information indicative of the contour of said first pattern and the design information of said second pattern.

4. A sample measuring method according to claim 2, wherein said contour information of said first pattern is formed on the basis of positional alignment between said first pattern and its design information.

5. A sample measuring method according to claim 1, wherein the first and second patterns form portions of a same line pattern.

6. A sample measuring method according to claim 1, wherein the second pattern is on a same layer as the first pattern and overlaps the first pattern in plan view.

7. A measuring device comprising:

an operation unit, including a computer, for measuring a pattern on a sample by using an image formed on the basis of electrons acquired under scanning of a charged particle beam on the sample, wherein the computer is configured to:

combine information concerning a formed first pattern based on a first image of the first pattern, which is formed by a first exposure of double patterning using a reduced projection exposure apparatus, with design information of a second pattern to be formed by a second exposure of the double patterning to thereby form a combined information template, the first image being of the formed first pattern prior to formation of the second pattern and not including the second pattern, acquire a second image of said first and second patterns formed by the first and second exposures, respectively, perform a first matching between the information concerning the formed first pattern in said combined information template and the first pattern in said second image to thereby acquire a first position for the design information of said second pattern, perform a second matching between the design information of said second pattern in said combined information template and information concerning the second pattern in said second image to thereby acquire a second position for the design information of said second pattern, and calculate a displacement between the first and second positions.

8. A measuring device according to claim 7, wherein the information concerning said first pattern is information indicative of a contour of the first pattern extracted from the first image of said first pattern.

9. A sample measuring device according to claim 8, wherein said combined information template is formed by combining the information indicative of the contour of the first pattern and the design information of said second pattern.

10. A sample measuring device according to claim 8, wherein said contour information of said first pattern is formed on the basis of positional alignment between said first pattern and its design information.

11. A sample measuring device according to claim 7, wherein the first and second patterns form portions of a same line pattern.

12. A sample measuring device according to claim 7, wherein the second pattern is on a same layer as the first pattern and overlaps the first pattern in plan view.

13. A sample measuring device comprising:

an operation unit for measuring a pattern on a sample by using an image formed on the basis of electrons acquired under scanning of a charged particle beam on the sample; and a critical dimension scanning electron microscope that scans the charged particle beam on the sample, wherein the operation unit is configured to:

combine information concerning a formed first pattern based on a first image of the first pattern, which is formed by a first exposure of double patterning using a reduced projection exposure apparatus, with design information of a second pattern to be formed by a second exposure of the double patterning to thereby form a combined information template, the first image being of the formed first pattern prior to formation of the second pattern and not including the second pattern, acquire a second image of said first and second patterns formed by the first and second exposures, respectively, perform a first matching between the information concerning the formed first pattern in said combined information template and the first pattern in said second image to thereby acquire a first position for the design information of said second pattern, perform a second matching between the design information of said second pattern in said combined information template and information concerning the second pattern in said second image to thereby acquire a second position for the design information of said second pattern, and calculate a displacement between the first and second positions.

* * * * *